(12) United States Patent
Chang et al.

(10) Patent No.: US 11,770,951 B2
(45) Date of Patent: Sep. 26, 2023

(54) DISPLAY DEVICE

(71) Applicant: LG ELECTRONICS INC., Seoul (KR)

(72) Inventors: Chunsoo Chang, Seoul (KR); Heungsu Kim, Seoul (KR); Hyunsik Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 80 days.

(21) Appl. No.: 17/597,314

(22) PCT Filed: Feb. 27, 2020

(86) PCT No.: PCT/KR2020/002835
§ 371 (c)(1),
(2) Date: Jan. 3, 2022

(87) PCT Pub. No.: WO2021/010564
PCT Pub. Date: Jan. 21, 2021

(65) Prior Publication Data
US 2022/0320458 A1    Oct. 6, 2022

(30) Foreign Application Priority Data

Jul. 17, 2019 (KR) .................. 10-2019-0086625

(51) Int. Cl.
*H04R 1/02* (2006.01)
*H10K 50/87* (2023.01)
*H05K 5/02* (2006.01)

(52) U.S. Cl.
CPC ............ *H10K 50/87* (2023.02); *H04R 1/028* (2013.01); *H05K 5/0213* (2013.01); *H04R 2499/15* (2013.01)

(58) Field of Classification Search
CPC .... H04R 1/028; H04R 2499/15; H10K 50/87; H05K 5/0213; G02F 1/133608
See application file for complete search history.

(56) References Cited

U.S. PATENT DOCUMENTS

2006/0070280 A1* 4/2006 Yamamura ............... H04N 5/64
40/564
2006/0125365 A1 6/2006 Kim et al.
(Continued)

FOREIGN PATENT DOCUMENTS

KR      10-0496298       6/2005
KR    10-2016-0055021    5/2016
(Continued)

OTHER PUBLICATIONS

PCT International Application No. PCT/KR2020/002835, International Search Report dated Jun. 16, 2020, 5 pages.

*Primary Examiner* — Jason R Kurr
(74) *Attorney, Agent, or Firm* — LEE HONG DEGERMAN KANG & WAIMEY

(57) ABSTRACT

A display device is disclosed. The display device of the present invention comprises: a display panel; an inner plate positioned at the rear of the display panel; a module cover positioned at the rear of the inner plate; electronic components mounted on the rear of the module cover; and a back cover positioned at the rear of the module cover and covering the electronic components, wherein the module cover may include a body portion positioned at the rear of the inner plate, and an extension portion extending from the body portion so as to cover at least a portion of a side surface of the display panel and the inner plate.

8 Claims, 8 Drawing Sheets

(56) References Cited

U.S. PATENT DOCUMENTS

2015/0092394 A1\* 4/2015 Sakurada .......... G02F 1/133608
362/97.1
2015/0163574 A1\* 6/2015 Hamadate .............. H04R 1/345
381/388

FOREIGN PATENT DOCUMENTS

KR 10-2016-0075236 6/2016
KR 10-1903398 10/2018

\* cited by examiner

[FIG. 1]
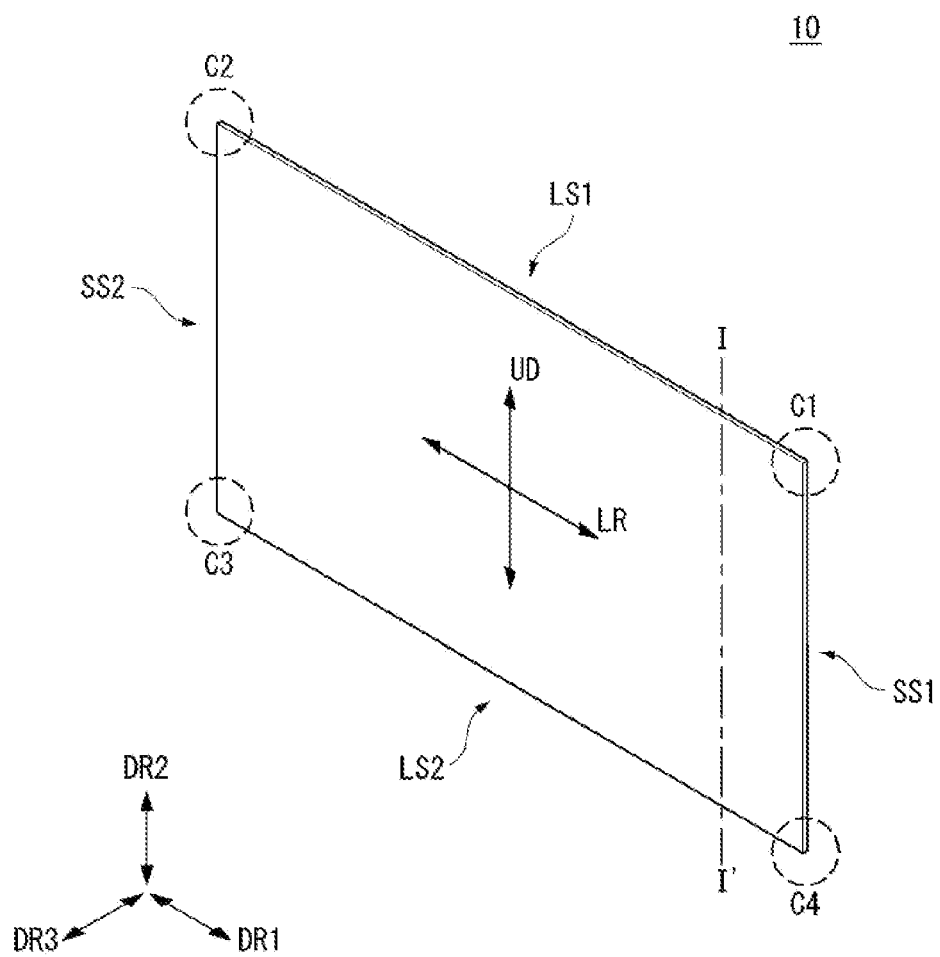

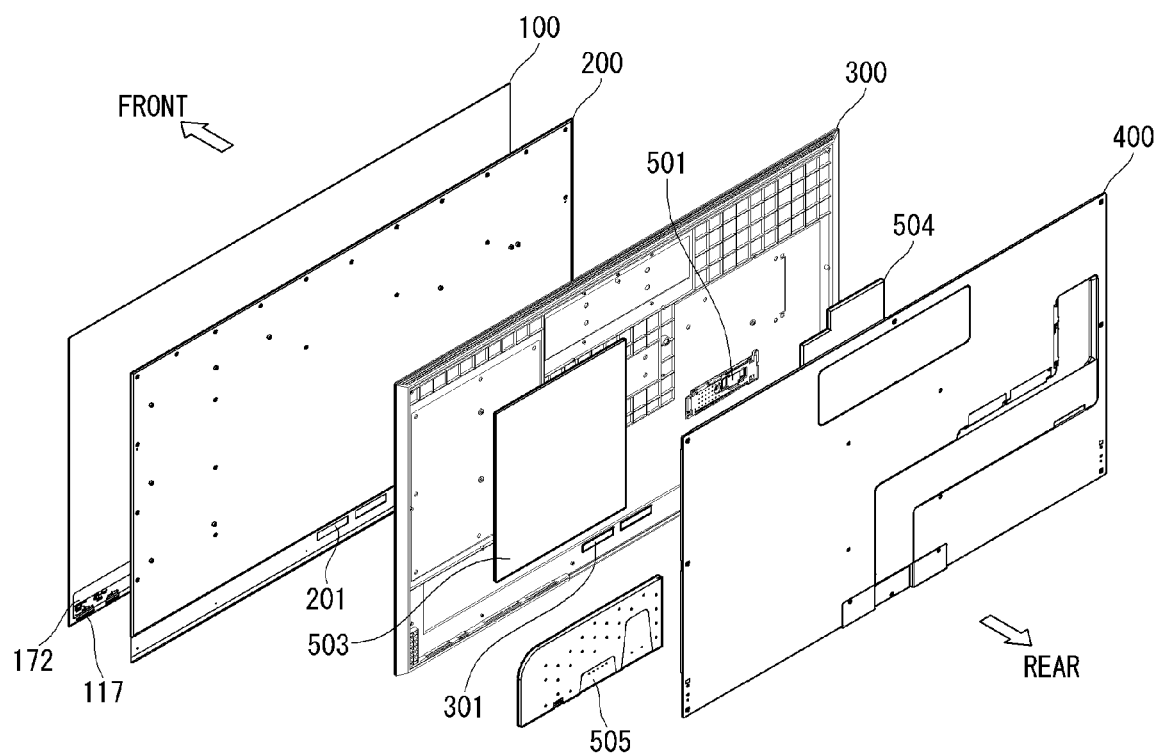
[FIG. 2]

[FIG. 3]
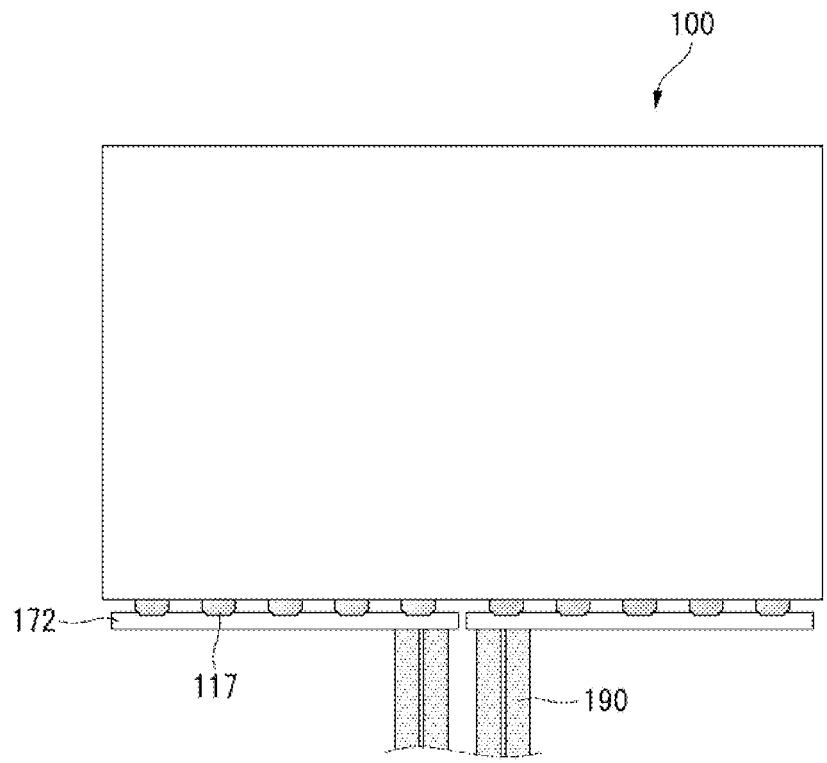
[FIG. 4]
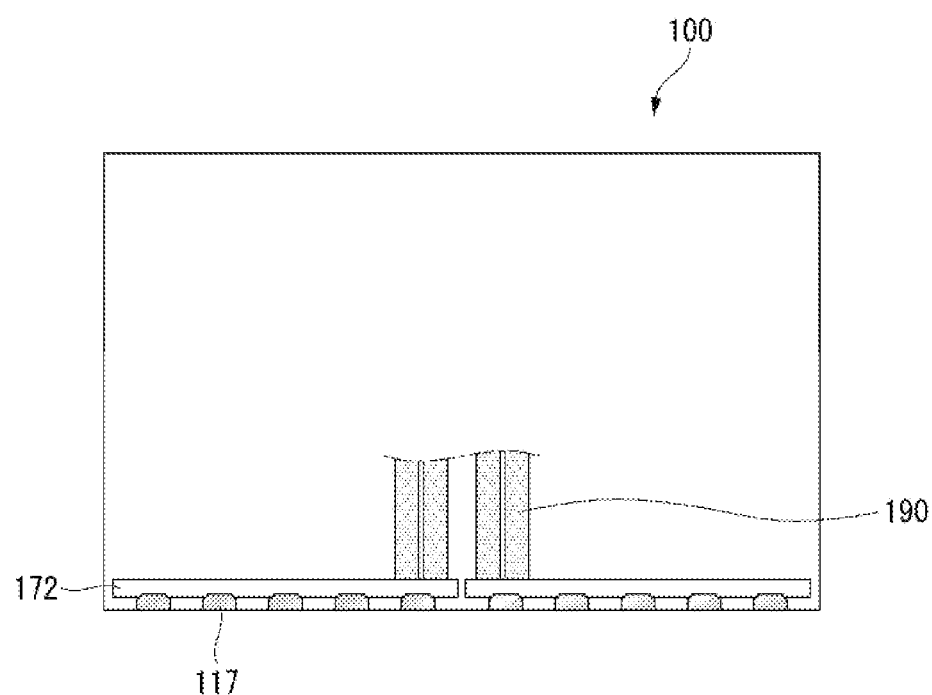

[FIG. 5]
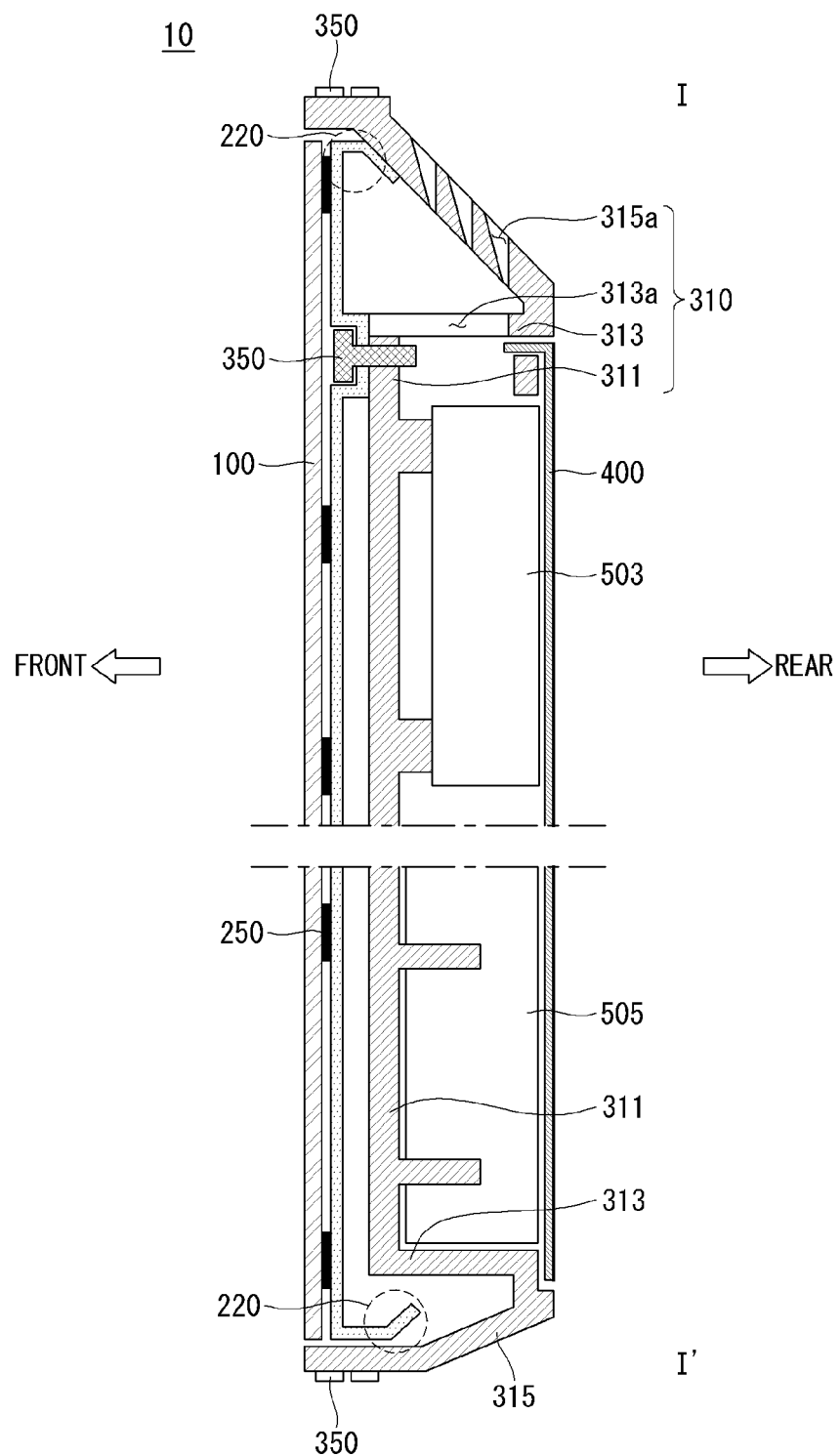

[FIG. 6]
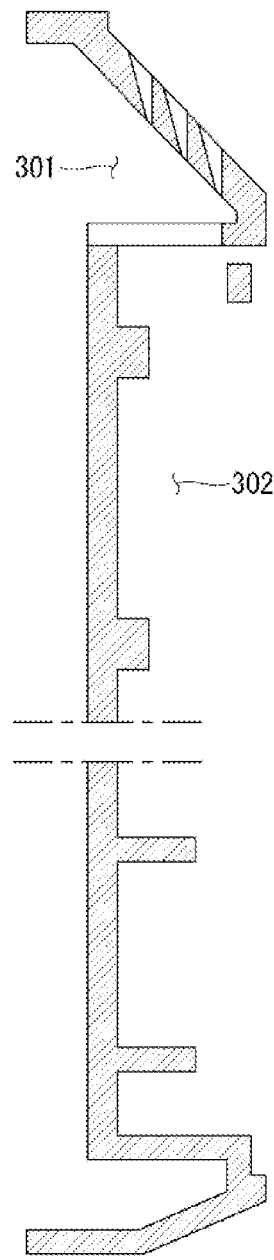

[FIG. 7]
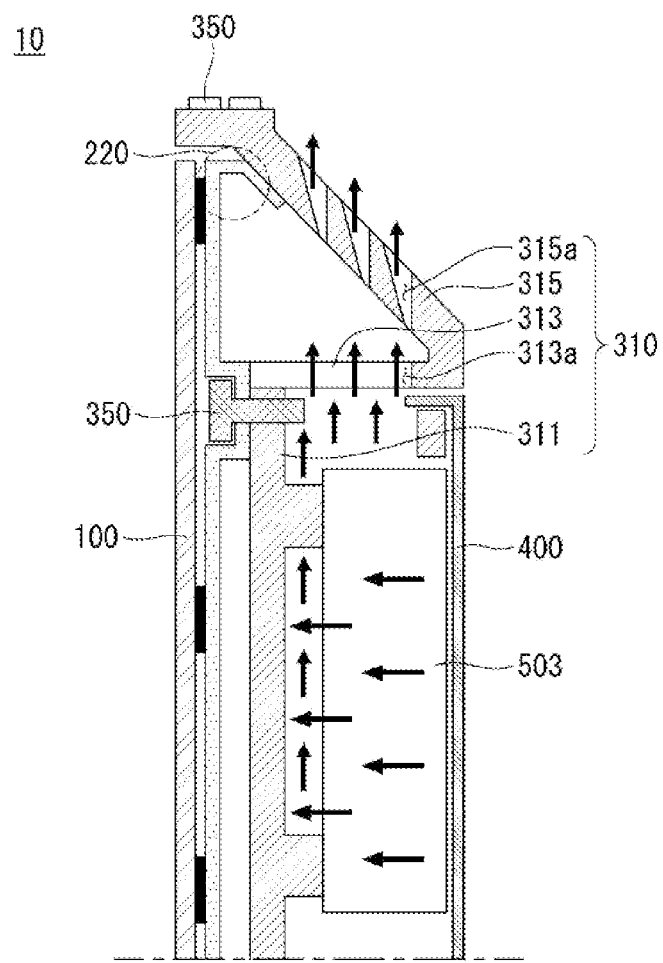

[FIG. 8]
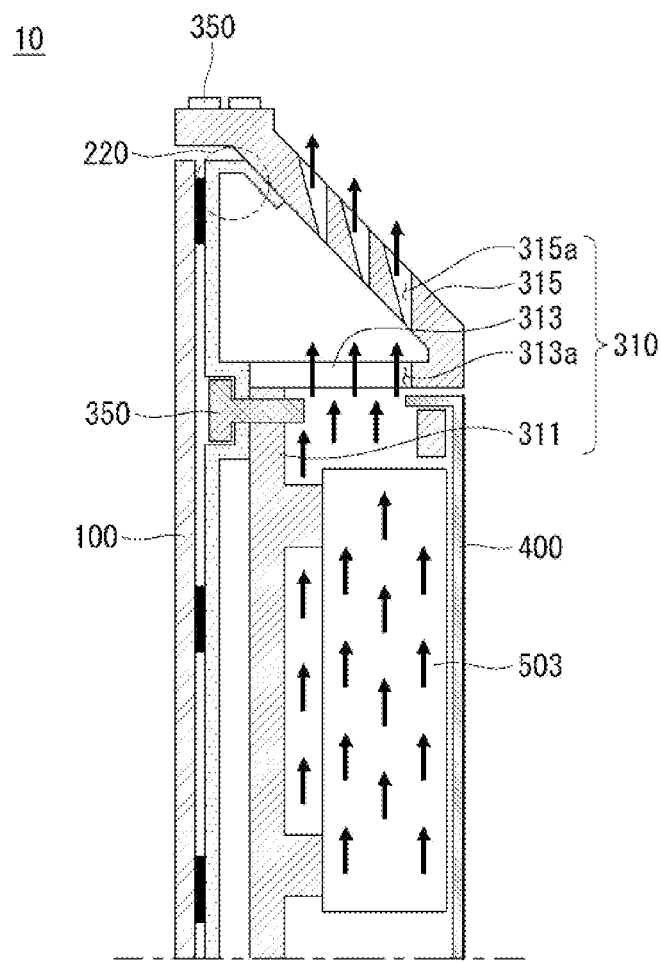

[FIG. 9]
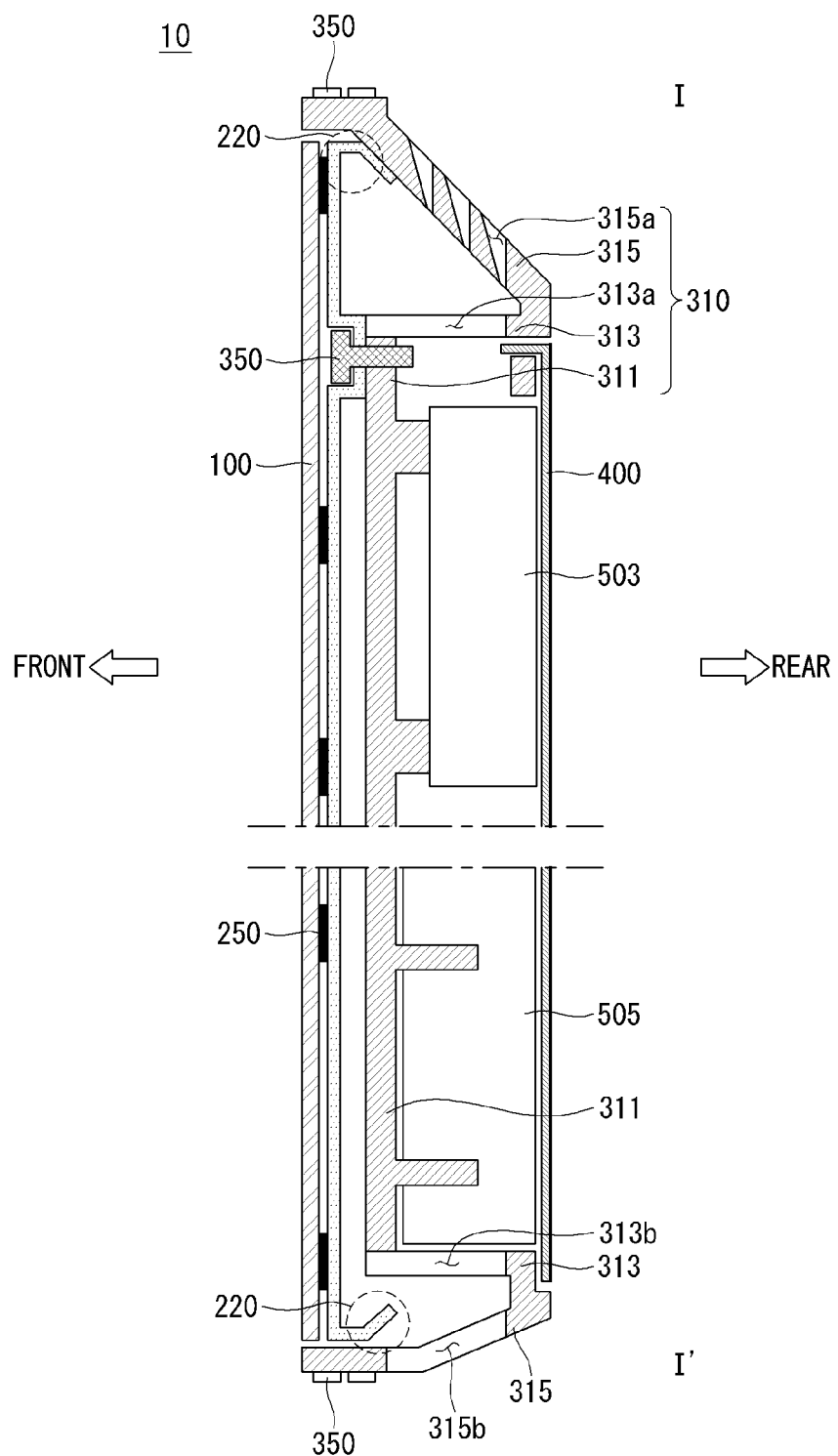

DISPLAY DEVICE

CROSS-REFERENCE TO RELATED APPLICATIONS

This application is the National Stage filing under 35 U.S.C. 371 of International Application No. PCT/KR2020/002835, filed on Feb. 27, 2020, which claims the benefit of earlier filing date and right of priority to Korean Application No. 10-2019-0086625, filed on Jul. 17, 2019, the contents of which is hereby incorporated by reference herein in its entirety.

TECHNICAL FIELD

The present disclosure relates to a display device. More specifically, the present disclosure relates to a display device having a heat dissipation structure capable of easily dissipating heat generated from a panel and circuit components.

BACKGROUND ART

With the development of the information society, various types of demands for display devices are increasing. Various display devices such as a liquid crystal display (LCD), a plasma display panel (PDP), an electroluminescent display (ELD), a vacuum fluorescent display (VFD), and an organic light emitting diode (OLED) display have been recently studied and used in response to the various types of demands.

Out of the various display devices, an OLED panel can display an image by depositing an organic layer, which is able to emit light by itself, on a substrate on which transparent electrodes are formed. The OLED panel can have a thin profile and flexible characteristics. Many studies have been made on structural characteristics of display devices including the OLED panel described above.

DISCLOSURE

Technical Problem

An object of the present disclosure is to address the above-described and other problems.

Another object of the present disclosure is to provide a display device having a heat dissipation structure for smoothly dissipating heat generated from a panel and/or circuit components to the outside.

Another object of the present disclosure is to simplify an assembly process and reduce the manufacturing cost by reducing the number of case members constituting a display device.

Technical Solution

To achieve the above-described and other objects, in one aspect of the present disclosure, there is provided a display device comprising a display panel; an inner plate positioned at a rear of the display panel; a module cover positioned at a rear of the inner plate; an electronic component seated at a rear of the module cover; and a back cover positioned at the rear of the module cover and configured to cover the electronic component, wherein the module cover includes a body portion positioned at the rear of the inner plate; and an extension portion extended from the body portion and configured to cover at least a part of a side of each of the display panel and the inner plate.

According to another aspect of the present disclosure, the extension portion may include a vent hole opened toward the outside at an upper side of the display device.

According to another aspect of the present disclosure, the extension portion may include a first extension portion extended rearward from an end of the body portion; and a second extension portion extended forward from an end of the first extension portion and configured to cover at least a part of the side of the display panel. The electronic component may be accommodated in a rear accommodation portion provided by the body portion and the first extension portion, and the display panel and the inner plate may be accommodated in a front accommodation portion provided by the body portion and the second extension portion.

According to another aspect of the present disclosure, the vent hole may include a first vent hole passing through the first extension portion, the first vent hole being opened toward the second extension portion and opened toward the electronic component; and a second vent hole passing through the second extension portion, the second vent hole being opened toward the first vent hole and opened toward the outside.

According to another aspect of the present disclosure, one end of the inner plate may include a bending portion that is bent toward the rear, and the bending portion may be positioned in an inner space provided between the first extension portion and the second extension portion.

According to another aspect of the present disclosure, the module cover may be a thermal insulation member.

According to another aspect of the present disclosure, wherein the module cover may be formed of a plastic material.

According to another aspect of the present disclosure, the inner plate may include aluminum or aluminum alloy.

According to another aspect of the present disclosure, the electronic component may include a speaker configured to provide a sound. The extension portion may include a sound hole that is positioned at a lower side of the display panel and is opened toward the speaker and opened to the outside.

According to another aspect of the present disclosure, the sound hole may include a first sound hole passing through the first extension portion, the first sound hole being opened toward the second extension portion and opened toward the speaker; and a second sound hole passing through the second extension portion, the second sound hole being opened toward the first sound hole and opened toward the outside.

Advantageous Effects

Effects of a display device according to the present disclosure are described as follows.

According to at least one aspect of the present disclosure, the present disclosure can simplify an assembly process and reduce the manufacturing cost.

According to at least one aspect of the present disclosure, the present disclosure can efficiently dissipate heat generated from a display panel and/or circuit components.

DESCRIPTION OF DRAWINGS

FIG. 1 is a perspective view schematically illustrating a display device according to an embodiment of the present disclosure.

FIG. 2 is an exploded perspective view illustrating a display device according to an embodiment of the present disclosure.

FIGS. 3 and 4 illustrate a rear surface of a display panel according to an embodiment of the present disclosure.

FIG. 5 is a cross-sectional view illustrating a display device according to an embodiment of the present disclosure.

FIG. 6 is a cross-sectional view illustrating a module cover according to an embodiment of the present disclosure.

FIGS. 7 and 8 illustrate an effect of a heat dissipation path according to an embodiment of the present disclosure.

FIG. 9 is a cross-sectional view illustrating a display device according to another embodiment of the present disclosure.

MODE FOR INVENTION

Reference will now be made in detail to embodiments of the disclosure, examples of which are illustrated in the accompanying drawings. Wherever possible, the same reference numbers will be used throughout the drawings to refer to the same or like parts.

In general, a suffix such as "module" and "unit" may be used to refer to elements or components. Use of such a suffix herein is merely intended to facilitate description of the present disclosure, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Hereinafter, embodiments of the present disclosure are described using an organic light emitting diode (OLED) display panel as an example of a display panel. However, embodiments of the present disclosure are not limited thereto.

FIG. 1 is a perspective view schematically illustrating a display device according to an embodiment of the present disclosure. FIG. 2 is an exploded perspective view illustrating a display device according to an embodiment of the present disclosure. FIGS. 3 and 4 illustrate a rear surface of a display panel according to an embodiment of the present disclosure.

Referring to FIG. 1, a display device 10 may include a first long side LS1, a second long side LS2 opposite the first long side LS1, a first short side SS1 adjacent to the first long side LS1 and the second long side LS2, and a second short side SS2 opposite the first short side SS1.

In embodiments disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite the third side area.

Embodiments of the present disclosure illustrate and describe that lengths of the first and second long sides LS1 and LS2 are longer than lengths of the first and second short sides SS1 and SS2 for convenience of explanation. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display device 10, and a second direction DR2 may be a direction parallel to the short sides SS1 and SS2 of the display device 10.

The first direction DR1 may be parallel to a horizontal axis. The first direction DR1 may be referred to as a first horizontal axis. The second direction DR2 may be parallel to a vertical axis. The second direction DR2 may be referred to as the vertical axis. A third direction DR3 may be parallel to the horizontal axis. The third direction DR3 may be referred to as a second horizontal axis.

A side of the display device 10 on which an image is displayed may be referred to as a forward direction or a front surface. When the display device 10 displays an image, a side of the display device 10 at which the image cannot be observed may be referred to as a rearward direction or a rear surface. The third direction DR3 may be a back-and-forth direction.

When the display device 10 is viewed from the forward direction or the front surface, the first long side LS1 may be referred to as an upper side or an upper surface. In the same manner, the second long side LS2 may be referred to as a lower side or a lower surface. In the same manner, the first short side SS1 may be referred to as a right side or a right surface, and the second short side SS2 may be referred to as a left side or a left surface.

A lateral side of the display device 10 may indicate at least one of the upper surface, the lower surface, the right surface, and the left surface of the display device 10.

Further, the first long side LS1, the second long side LS2, the first short side SS1, and the second short side SS2 may be referred to as edges of the display device 10. Positions where the first long side LS1, the second long side LS2, the first short side SS1, and the second short side SS2 meet each other may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

Referring to FIG. 2, a display panel 100 may be provided on the front surface of the display device 10 and may display an image. The display panel 100 may divide the image into a plurality of pixels and adjust hue, brightness, and saturation for each pixel to output the image. The display panel 100 may be divided into an active area in which the image is displayed, and an inactive area in which the image is not displayed.

The display panel 100 may include an OLED display panel. The display panel 100 may emit light by itself. The display panel 100 may have a very thin thickness.

The display panel 100 may be fastened to a case member. The case member may include an inner plate 200, a module cover 300, and a back cover 400.

The inner plate 200 may be disposed behind the display panel 100. The inner plate 200 may be attached to a rear surface of the display panel 100. The inner plate 200 may be coupled to the rear surface of the display panel 100 by one or more adhesive members.

The inner plate 200 may provide rigidity to the display panel 100. The inner plate 200 may receive heat from the display panel 100 and dissipate the heat. The inner plate 200 may have high thermal conductivity. The inner plate 200 may include metal. The inner plate 200 may include aluminum or aluminum alloy.

The module cover 300 may be positioned in the rear of the inner plate 200. The module cover 300 may form an inner space at the front. The display panel 100 and the inner plate 200 may be accommodated in the inner space provided at the front of the module cover 300. The module cover 300 may cover at least a part of the side of each of the inner plate 200 and the display panel 100. The inner space provided at the front of the module cover 300 may be referred to as a front accommodation portion 301 (see FIG. 5).

The module cover 300 may form an inner space at the rear. An electronic component may be accommodated in the inner space provided at the rear of the module cover 300. The electronic component may include a timing controller board 501, a power supply 503, a main board 504, a speaker 505, and the like. The electronic component may be fixed to the rear of the module cover 300. The inner space provided at the rear of the module cover 300 may be referred to as a rear accommodation portion 302 (see FIG. 5). The electronic component may be seated in the rear accommodation portion 302 (see FIG. 5). The rear accommodation portion 302 (see FIG. 5) may be divided into a plurality of portions to provide a plurality of spaces, and the electronic components may be respectively accommodated in the divided spaces.

The module cover 300 may be formed of a polymer material. The module cover 300 may be formed of a plastic material. That is, the module cover 300 may be formed of a plastic-based material that can be molded. The module cover 300 may be formed of polycarbonate, but is not limited thereto.

The module cover 300 and the inner plate 200 may be fixed to each other through at least one fixing member. The fixing member may be a screw, but is not limited thereto.

The back cover 400 may be positioned at the rear of the module cover 300. The back cover 400 may cover at least a portion of a rear surface of the module cover 300. The back cover 400 may be positioned to cover the rear accommodation portion 302 (see FIG. 5) of the module cover 300. The back cover 400 may protect the electronic components accommodated in the rear accommodation portion 302 (see FIG. 5) of the module cover 300.

The back cover 400 may be made of a different material from the module cover 300. For example, the back cover 400 may include a metal material. The back cover 400 may be formed through a press process. The back cover 400 and the module cover 300 may be fixed to each other through at least one fixing member. The fixing member may be a screw. Preferably, the fixing member may be a latch. As the back cover 400 and the module cover 300 are fastened using a plurality of latches, they may be free from space constraints with surrounding members or components. Accordingly, a degree of freedom in design can be improved.

Referring to FIG. 3, a member layer 117 may extend from one side of the display panel 100. For example, the member layer 117 may have a shape extending from the second long side LS2 of the display panel 100. A plurality of member layers 117 may be provided. The member layer 117 may be electrically connected to the display panel 100. The member layer 117 may include at least one of a chip on film (COF), a chip on glass (COG), a flexible printed circuit board (FPCB), and a tape carrier package (TCP).

A source PCB 172 may have a shape extending from the member layer 117. The source PCB 172 may be electrically connected to the member layer 117. A plurality of source PCBs 172 may be provided.

A cable 190 may have a shape extending from the source PCB 172. The cable 190 may be electrically connected to the source PCB 172. A plurality of cables 190 may be provided.

The power or/and signal provided to the cable 190 may be transferred to the source PCB 172. The power or/and signal provided to the source PCB 172 may be distributed to the member layers 117. The power or/and signal distributed to the member layers 117 may be supplied to the display panel 110.

Referring to FIGS. 3 and 4, the member layer 117 may be flexible. The member layer 117 may be bent toward the rear surface of the display panel 100. The member layer 117 may be positioned at the rear of the display panel 100. The source PCB 172 connected to the member layer 117 may be disposed at the rear of the display panel 100. The cable 190 connected to the source PCB 172 may be disposed at the rear of the display panel 100.

The inner plate 200 may include a first slot 201. The first slot 201 may be formed to pass through a thickness of the inner plate 200. The first slot 201 may be formed adjacent to a lower surface of the inner plate 200. The number of first slots 201 may correspond to the number of cables 190, and each cable 190 may pass through the corresponding first slot 201 and extend toward the rear of the inner plate 200. However, the present disclosure is not limited thereto, and, for example, the plurality of cables 190 can pass through one first slot 201.

The module cover 300 may include a second slot 301. The second slot 301 may be formed to pass through a thickness of the module cover 300. The second slot 301 may be formed adjacent to a lower surface of the module cover 300. The number of the second slots 301 may be the same as the number of cables 190, and each cable 190 may pass through the corresponding second slot 301 and extend toward the rear of the module cover 300. However, the present disclosure is not limited thereto, and, for example, the plurality of cables 190 can pass through one second slot 301. The second slot 301 may overlap the first slot 201. The number of second slots 301 may be the same as the number of first slots 201.

As described above, the cable 190 may pass through the first slot 201 and the second slot 301 and may be electrically connected to the electronic component positioned at the rear of the module cover 300. For example, the cable 190 may be electrically connected to the timing controller board 501 to receive the power or/and signal.

FIG. 5 is a cross-sectional view illustrating a display device according to an embodiment of the present disclosure. FIG. 6 is a cross-sectional view illustrating a module cover according to an embodiment of the present disclosure. FIGS. 7 and 8 illustrate an effect of a heat dissipation path according to an embodiment of the present disclosure.

Referring to FIGS. 5 and 6, a display device 10 according to an embodiment of the present disclosure may include a display panel 100 and a case member. The case member may include an inner plate 200, a module cover 300, and a back cover 400.

The display panel 100 may implement an input image toward the front in response to a predetermined signal. The display panel 100 may include an organic light emitting diode (OLED) element, but is not limited thereto.

The inner plate 200 may be positioned at the rear of the display panel 100. The inner plate 200 may receive heat from the display panel 100 and dissipate the heat. The inner plate 200 may be a heat dissipation path for dissipating light provided from the display panel 100.

The inner plate 200 may be formed of aluminum or aluminum alloy with high thermal conductivity. Hence, since heat generated in the display panel 100 can be smoothly discharged to the outside along the inner plate 200, it is possible to prevent a defect in which stain on the display panel 100 is perceived.

In addition, since aluminum with high thermal conductivity is used for the inner plate 200, even if the inner plate 200 is formed to have a relatively small thickness, the inner plate 200 can effectively dissipate heat. That is, because the inner plate 200 has the relatively high thermal conductivity by adopting aluminum with high thermal conductivity, an amount of heat transferred per unit time required can be satisfied even if the inner plate 200 is formed to have a relatively small thickness. Therefore, a preferred embodiment of the present disclosure can apply the thin inner plate 200, and thus has an advantage of providing a lightweight and slim display device 10.

An edge of the inner plate 200 may include a bending portion 220 bent in a different direction from the extending direction of the inner plate 200. For example, the bending portion 220 may refer to a portion of the edge of the inner plate 200 that is bent backward. The bending portion 220 may also be referred to as a curling portion. The bending portion 220 may have a shape bent a plurality of times. The inner plate 200 has the advantage of securing a predetermined rigidity by including the bending portion 220.

An adhesive member 250 may be interposed between the inner plate 200 and the display panel 100. The inner plate 200 and the display panel 100 may be fixed to each other through one or more adhesive members 250. The adhesive member 250 may be a double-sided tape, but is not limited thereto.

When the inner plate 200 and the display panel 100 are spaced apart from each other by a predetermined distance, a thermal insulation layer such as an air layer may be formed between the inner plate 200 and the display panel 100. In this case, heat transfer from the display panel 100 to the inner plate 200 may not be smoothly performed. To prevent this, the plurality of adhesive members 250 may be provided and distributed over the entire area. The plurality of adhesive members 250 may function to maintain a distance between the inner plate 200 and the display panel 100 to have a predetermined distance in the entire area. Accordingly, the preferred embodiment of the present disclosure has an advantage of effectively dissipating heat generated in the display panel 100 through the inner plate 200.

The module cover 300 may be positioned at the rear of the inner plate 200. The module cover 300 may be formed of a plastic material. That is, the module cover 300 may be formed of a plastic-based material that can be molded. The module cover 300 may be fixed to the inner plate 200 through a fixing member 350. The fixing member may be a screw, but is not limited thereto.

As described above, the module cover 300 may include a front accommodation portion 301 for providing an accommodation space to the front and a rear accommodation portion 302 for providing an accommodation space to the rear. More specifically, the module cover 300 may include a body portion 311 and extension portions 313 and 315 extending from the body portion 311. The front accommodation portion 301 and the rear accommodation portion 302 may be formed by the body portion 311 and the extension portions 313 and 315.

The body portion 311 may be positioned to face the rear surface of the inner plate 200 and cover the rear surface of the inner plate 200. An electronic component 503 may be positioned at the rear of the body portion 311. The electronic component 503 may be fixed to a rear surface of the body portion 311. A PCB plate may be interposed between the body portion 311 and the electronic component 503. In this case, the body portion 311 may be fixed to a front surface of the PCB plate, and the electronic component 503 may be fixed to a rear surface of the PCB plate.

Referring to FIG. 7, as the body portion 311 is formed of a plastic material, high-temperature heat generated in the electronic component 503 can be blocked from being transferred to the display panel 100. That is, the body portion 311 may be positioned between the display panel 100 and the electronic component 503 to function as a thermal insulation member capable of blocking heat transfer.

More specifically, if only the inner plate 200 made of a material with high thermal conductivity exists between the display panel 100 and the electronic component 503, or the body portion 311 is made of a metal material with high thermal conductivity, etc., heat generated in the electronic component 503 may be transferred to the display panel 100 as it is. In this case, defects such as deterioration of the elements formed at the display panel 100 or deformation of the panel shape may occur, which is a problem. In a preferred embodiment of the present disclosure, the body portion 311 made of a plastic material capable of performing a predetermined thermal insulation function is disposed between the display panel 100 and the electronic component 503 and thus can efficiently block heat transfer to the display panel 100. Accordingly, the preferred embodiment of the present disclosure has an advantage of preventing a damage and deformation of the display panel 100 due to heat transfer.

Referring again to FIG. 5, the extension portions 313 and 315 may include a first extension portion 313 and a second extension portion 315. The body portion 311 and the extension portions 313 and 315 may be formed as one body.

The first extension portion 313 may extend rearward from one end of the body portion 311. An interior angle formed by the body portion 311 and the first extension portion 313 may be a right angle, but is not limited thereto. An inner space that is provided by the body portion 311 and the first extension portion 313 to be opened toward the rear may be referred to as the rear accommodation portion 302. That is, the rear accommodation portion 302 may be provided by the body portion 311 and the first extension portion 313. The rear accommodation portion 302 may accommodate the electronic component 503 positioned at the rear of the module cover 300. The first extension portion 313 may cover a side surface of the electronic component 503 positioned at the rear of the module cover 300 from the outside.

The second extension portion 315 may extend forward from one end of the first extension portion 313. An interior angle formed by the first extension portion 313 and the second extension portion 315 may be an acute angle, but is not limited thereto. The second extension portion 315 may protrude more forward than the body portion 311. A portion of the second extension portion 315 that protrudes more forward than the body portion 311 may be referred to as a protrusion.

An inner space that is provided by the body portion 311 and the protrusion of the second extension portion 315 to be opened toward the front may be referred to as the front accommodation portion 301. That is, the front accommodation portion 301 may be provided by the body portion 311 and the protrusion of the second extension portion 315. The front accommodation portion 301 may accommodate the inner plate 200 and the display panel 100 positioned at the front of the module cover 300. The protrusion may cover at least a portion of a side surface of the inner plate 200 from the outside.

The related art has adopted a separate case member such as a middle cabinet in order to protect the edge of the display panel 100. However, in a preferred embodiment of the present disclosure, one module cover 300 can perform a function of a middle cabinet. Accordingly, the preferred embodiment of the present disclosure has an advantage of providing the lightweight display device 10 by reducing the number of components. In addition, since the number of assembly processes can be reduced as the number of components is reduced, there is an advantage in that the product yield can be improved.

A pattern 350 may be formed outside the second extension portion 315. The pattern 350 may be formed using a hot stamping process. For example, the pattern 350 may be formed by transferring a metal foil onto the second extension portion 315 made of a plastic material through heat and pressure. The pattern 350 is a design element applied to the second extension portion 315, and can improve the aesthetics of the display device 10.

An end of the inner plate 200 may be positioned in an inner space provided between the first extension portion 313 and the second extension portion 315. The end of the inner plate 200 accommodated in the inner space may be the bending portion 220. Since the bending portion 220 can be positioned in the inner space, there is an advantage in that there is no need to allocate a separate space for arranging the bending portion 220. The bending direction of the bending portion 220 may correspond to the extending direction of the second extension portion 315.

On the upper side of the display device 10, the extension portions 313 and 315 may include vent holes 313a and 315a that are opened toward the outside. The vent holes 313a and 315a may be a heat dissipation path of heat generated in the electronic component 503 positioned at the rear of the module cover 300.

The first extension portion 313 may include a first vent hole 313a at the upper side of the display device 10. The plurality of first vent holes 313a may be provided. The first vent hole 313a may be formed to pass through a thickness of the first extension portion 313. The first vent hole 313a may be opened toward the second extension portion 315 and may be opened toward the electronic component 503. The first vent hole 313a may be opened upward. The first vent hole 313a may function as a part of the heat dissipation path for dissipating high-temperature heat that is generated in the electronic component 503 and moves upward.

The second extension portion 315 may include a second vent hole 315a at the upper side of the display device 10. The plurality of second vent holes 315a may be provided. The second vent hole 315a may be formed to pass through a thickness of the second extension portion 315. The second vent hole 315a may be formed to be opened toward the outside and opened toward the first vent hole 313a of the first extension portion 313. The second vent hole 315a may be opened upward. The second vent hole 315a may function as a part of the heat dissipation path for dissipating high-temperature heat that is generated in the electronic component 503 and moves upward.

Referring to FIG. 8, in a preferred embodiment of the present disclosure, the vent holes 313a and 315a may be opened upward. That is, in a preferred embodiment of the present disclosure, the vent holes 313a and 315a may be opened upward. That is, in a preferred embodiment of the present disclosure, an opening direction of a vent slit may be an upward direction, that is a direction in which high-temperature heat moves due to convection. Accordingly, since a preferred embodiment of the present disclosure can minimize a movement path of heat, more efficient heat dissipation can be achieved.

As a comparative example, the vent holes 313a and 315a may be opened toward the rear. In this case, the moving path of high-temperature heat that is generated in the electronic component 503 and moves upward is extended, and heat dissipation may not be smoothly performed. That is, because the moving path of heat and the opening direction of the vent holes 313a and 315a do not correspond to each other, the heat dissipation efficiency may be reduced. Further, in many use environments, the rear of the display device 10 may be positioned adjacent to a support such as a wall. In this case, if the vent holes 313a and 315a are opened toward the rear, and heat dissipation may not be smoothly performed because the heat dissipation path is blocked by the support.

Referring again to FIG. 5, the back cover 400 may be positioned at the rear of the module cover 300. The back cover 400 may be disposed at the rear of the body portion 311 of the module cover 300 to cover the electronic components 503. The back cover 400 and the module cover 300 may be fixed to each other by a latch fixing structure. Alternatively, the back cover 400 and the module cover 300 may be fixed to each other by a fixing member such as a screw.

FIG. 9 is a cross-sectional view illustrating a display device according to another embodiment of the present disclosure.

Referring to FIG. 9, the second extension portion 315 may include sound holes 313b and 315b at the lower side of the display device 10. The sound holes 313b and 315b may include a first sound hole 313b formed in the first extension portion 313 and a second sound hole 315b formed in the second extension portion 315.

The first sound hole 313b may be formed to pass through a thickness of the first extension portion 313. The first sound hole 313b may be opened toward the second extension portion 315 and may be opened toward the speaker 505. The first sound hole 313b may function as a part of a sound path through which a sound provided by the speaker 505 propagates.

The second sound hole 315b may be formed to pass through a thickness of the second extension portion 315. The second sound hole 315b may be opened toward the first extension portion 313 and may be opened toward the outside. The second sound hole 315b may function as a part of a sound path through which a sound provided by the speaker 505 propagates.

The sound holes 313b and 315b at the lower side of the display device 10 may be a propagation path of sound provided by the speaker 505 positioned at the rear of the module cover 300. To this end, the sound holes 313b and 315b and the speaker 505 may overlap in the up-down direction. A preferred embodiment of the present disclosure can provide high-quality sound by setting the sound path in a predetermined direction.

Various modifications and changes can be made by those skilled in the art without departing from the technical spirit of the present disclosure through the above description. Accordingly, the technical scope of the present disclosure should not be limited to the detailed description of the present disclosure, but should be defined by the claims.

What is claimed is:

1. A display device comprising:
a display panel;
an inner plate positioned at a rear of the display panel;
a module cover positioned at a rear of the inner plate;
an electronic component seated at a rear of the module cover; and
a back cover positioned at the rear of the module cover and configured to cover the electronic component,
wherein the module cover includes:
a body portion positioned at the rear of the inner plate; and
an extension portion extended from the body portion and configured to cover at least a part of a side of each of the display panel and the inner plate,
wherein the extension portion includes a vent hole opened toward the outside at an upper side of the display device,
wherein the extension portion includes:
a first extension portion extended rearward from an end of the body portion; and
a second extension portion extended forward from an end of the first extension portion and configured to cover at least a part of the side of the display panel,
wherein the electronic component is accommodated in a rear accommodation portion provided by the body portion and the first extension portion, and
wherein the display panel and the inner plate are accommodated in a front accommodation portion provided by the body portion and the second extension portion.

2. The display device of claim 1, wherein the vent hole includes:
a first vent hole passing through the first extension portion, the first vent hole being opened toward the second extension portion and opened toward the electronic component; and
a second vent hole passing through the second extension portion, the second vent hole being opened toward the first vent hole and opened toward the outside.

3. The display device of claim 2, wherein one end of the inner plate
includes a bending portion that is bent toward the rear, and
wherein the bending portion is positioned in an inner space provided between the first extension portion and the second extension portion.

4. The display device of claim 2, wherein the module cover is a thermal insulation member.

5. The display device of claim 2, wherein the module cover is formed of a plastic material.

6. The display device of claim 2, wherein the inner plate includes aluminum or aluminum alloy.

7. The display device of claim 1, wherein the electronic component includes a speaker configured to provide a sound, and
wherein the extension portion includes a sound hole that is positioned at a lower side of the display panel and is opened toward the speaker and opened to the outside.

8. The display device of claim 7, wherein the sound hole includes:
a first sound hole passing through the first extension portion, the first sound hole being opened toward the second extension portion and opened toward the speaker; and
a second sound hole passing through the second extension portion, the second sound hole being opened toward the first sound hole and opened toward the outside.

* * * * *